United States Patent
Morita et al.

(10) Patent No.: US 9,059,492 B2
(45) Date of Patent: Jun. 16, 2015

(54) WAVEGUIDE INTERPOSER SUBSTRATE HAVING FIRST AND SECOND CONVERSION STRUCTURES ON OPPOSED WAVEGUIDE SURFACES

(71) Applicant: Sony Corporation, Tokyo (JP)

(72) Inventors: Shinya Morita, Tokyo (JP); Koichi Ikeda, Kanagawa (JP); Akira Akiba, Kanagawa (JP); Mitsuo Hashimoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 180 days.

(21) Appl. No.: 13/688,728

(22) Filed: Nov. 29, 2012

(65) Prior Publication Data
US 2013/0154759 A1    Jun. 20, 2013

(30) Foreign Application Priority Data
Dec. 14, 2011    (JP) .................. 2011-273547

(51) Int. Cl.
*H01P 5/107*    (2006.01)
*H01P 3/08*    (2006.01)

(52) U.S. Cl.
CPC ................ *H01P 3/081* (2013.01); *H01P 5/107* (2013.01)

(58) Field of Classification Search
CPC ......................................... H01P 5/107
USPC .................................... 333/26, 248
See application file for complete search history.

(56) References Cited

U.S. PATENT DOCUMENTS

| | | | |
|---|---|---|---|
| 3,528,041 A * | 9/1970 | Honda et al. ............ | 333/26 |
| 5,258,730 A * | 11/1993 | Stern et al. ............. | 333/246 |
| 6,242,984 B1 * | 6/2001 | Stones et al. ............ | 330/295 |
| 2010/0253450 A1 * | 10/2010 | Kim et al. .............. | 333/239 |

OTHER PUBLICATIONS

Soon Wee Ho, et al., "High RF Performance TSV Silicon Carrier for High Frequency Application", 2008, Electronic Components and Technology Conference, IEEE 2008.

* cited by examiner

*Primary Examiner* — Benny Lee
(74) *Attorney, Agent, or Firm* — Dentons US LLP

(57) ABSTRACT

A waveguide includes: a waveguide portion including a first surface and a second surface that are opposed to each other; a first transmission line provided on the first surface of the waveguide portion; a second transmission line provided on the second surface of the waveguide portion; and a first conversion structure inputting a signal from the first transmission line to the waveguide portion and converting the signal.

10 Claims, 3 Drawing Sheets

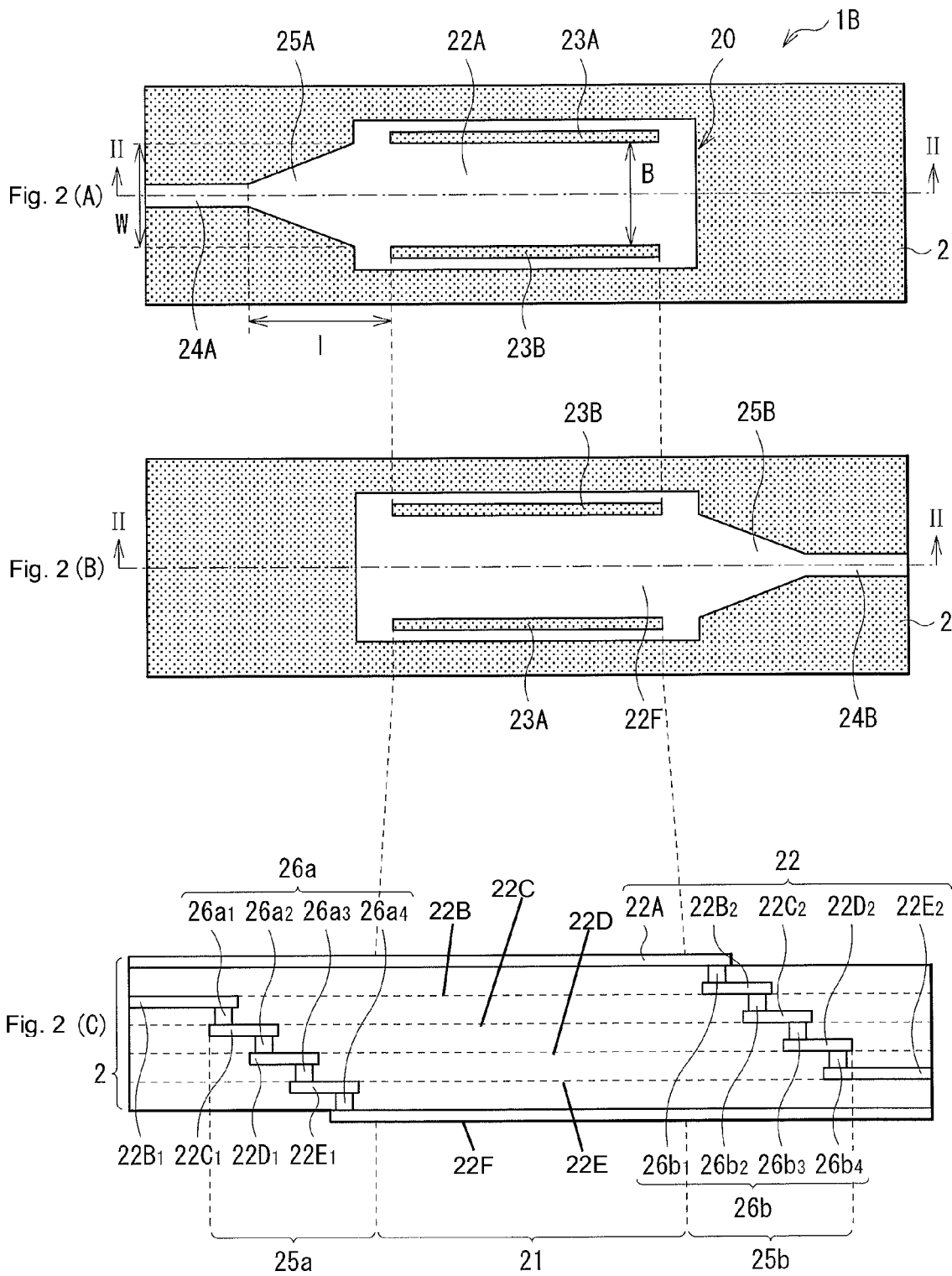

WAVEGUIDE INTERPOSER SUBSTRATE HAVING FIRST AND SECOND CONVERSION STRUCTURES ON OPPOSED WAVEGUIDE SURFACES

BACKGROUND

The present technology relates to a waveguide that transmits a signal between transmission lines, an interposer substrate including the waveguide, a module, and an electronic apparatus.

Mounting technology utilizing a relay board which is called an interposer is generally known as a technology used when an LSI (Large Scale Integration) chip having a fine pad pitch is to be mounted on a mounted substrate which is wide in pitch. Although the interposer is made of a dielectric such as a resin and a ceramic in many cases, a silicon interposer which is allowed to cope with finer pitch by using a silicon substrate and semiconductor process that allows micromachining attracts attention today.

In the above-mentioned silicon interposer, a front surface and a back surface of the silicon substrate are electrically connected to each other by a through electrode which is called a TSV (Through Silicon Via). Thus, a signal is transmitted from the front surface to the back surface of the silicon substrate. However, this silicon interposer has a disadvantage in that, in millimeter-wave bands and high frequency regions exceeding the millimeter-wave bands, return loss (or reflection loss) is increased due to impedance mismatching between a transmission line on the front surface of the substrate and the TSV.

A coaxial TSV that achieves impedance matching with a surface wiring by forming a coaxial form in a vertical direction of the silicon substrate is reported as one measure of eliminating this disadvantage (see, for example, Soon Wee Ho et al., IEEE Electronic Components and Technology Conference (ECTC), 2008).

SUMMARY OF THE INVENTION

However, the measure described above has a disadvantage in that development of a dedicated specific process or a novel material is unavoidable and hence the cost of manufacturing the silicon interposer is increased.

It is desirable to provide a waveguide that is allowed to suppress impedance mismatching to decrease reflection loss of an electric signal while suppressing manufacturing cost, and an interposer substrate including the waveguide, a module, and an electronic apparatus.

A waveguide according to an embodiment of the present technology includes: a waveguide portion including a first surface and a second surface that are opposed to each other; a first transmission line provided on the first surface of the waveguide portion; a second transmission line provided on the second surface of the waveguide portion; and a first conversion structure inputting a signal from the first transmission line to the waveguide portion and converting the signal.

An interposer substrate according to an embodiment of the present technology is provided with an insulating substrate and a waveguide provided in the substrate. The waveguide includes: a waveguide portion including a first surface and a second surface that are opposed to each other; a first transmission line provided on the first surface of the waveguide portion; a second transmission line provided on the second surface of the waveguide portion; and a first conversion structure inputting a signal from the first transmission line to the waveguide portion and converting the signal.

A module according to an embodiment of the present technology is provided with an interposer substrate and a semiconductor chip, in which the interposer substrate is provided with a waveguide in an insulating substrate and the semiconductor chip is mounted on the interposer substrate. The waveguide includes: a waveguide portion including a first surface and a second surface that are opposed to each other; a first transmission line provided on the first surface of the waveguide portion; a second transmission line provided on the second surface of the waveguide portion; and a first conversion structure inputting a signal from the first transmission line to the waveguide portion and converting the signal.

An electronic apparatus according to an embodiment of the present technology is provided with an interposer substrate, a semiconductor chip, and a mounted substrate, in which the interposer substrate is provided with a waveguide in an insulating substrate, the semiconductor chip is mounted on the interposer substrate, and the mounted substrate is electrically connected with the interposer substrate. The waveguide includes: a waveguide portion including a first surface and a second surface that are opposed to each other; a first transmission line provided on the first surface of the waveguide portion; a second transmission line provided on the second surface of the waveguide portion; and a first conversion structure inputting a signal from the first transmission line to the waveguide portion and converting the signal.

In the waveguide, the interposer substrate including the waveguide, the module, and the electronic apparatus according to the above-described respective embodiments of the present technology, the first surface of the first and the second surfaces, which are opposed to each other, of the waveguide portion is provided with the first transmission line having the conversion structure that inputs the signal into the waveguide portion and converts the signal, and the second surface thereof is provided with the second transmission line. Thereby, impedance mismatching is reduced.

According to the waveguide, the interposer substrate including the waveguide, the module, and the electronic apparatus of the above-described respective embodiments of the present technology, the first transmission line and the second transmission line are provided respectively on the first surface and the second surface of the waveguide portion, and the conversion structure is provided that inputs the signal from the first transmission line to the waveguide portion and converts the signal. Therefore, it is allowed to suppress the impedance mismatching and thereby to reduce the reflection loss of electric signal.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 2(A) and FIG. 2(B), are front and back side planar views and FIG. 2(C) is a sectional diagram illustrating an example of a waveguide according to a second embodiment of the present technology.

DETAILED DESCRIPTION OF THE PRESENTLY PREFERRED EMBODIMENTS

Next, preferred embodiments of the present technology will be described in detail with reference to the accompanying drawings. It is to be noted that a description will be made in the following order.

1. First Embodiment (an interposer substrate that includes a waveguide portion that uses a through electrode as a conversion structure)
2. Second Embodiment (an interposer substrate that includes a waveguide portion that uses a tapered microstrip as the conversion structure)
3. Application Examples (examples of a module and an electronic apparatus)

1. First Embodiment

[Configuration of Interposer Substrate 1A]

Figure 1A:
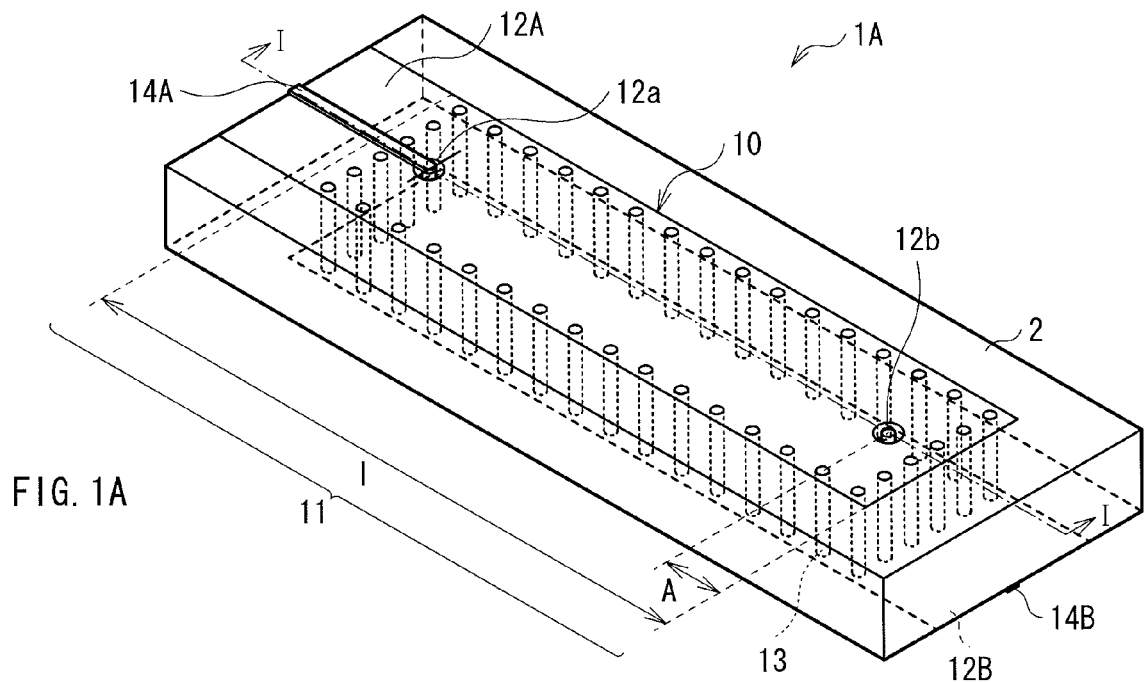
FIG. 1A and FIG. 1B are a perspective view and a sectional diagram, respectively, illustrating an example of a waveguide according to a first embodiment of the present technology.
Figure 1B:
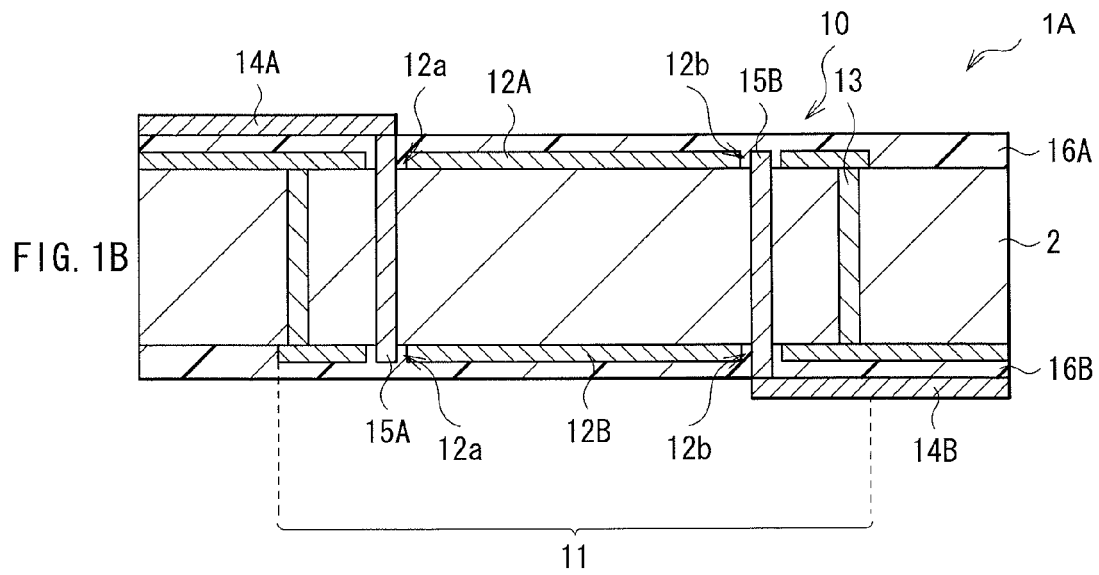

FIG. 1A is a perspective view of an example of the interposer substrate 1A that includes a waveguide 10 according to a first embodiment of the present technology. FIG. 1B illustrates an example of a sectional configuration of the interposer substrate 1A taken along the one dot chain line I-I in FIG. 1A. The interposer substrate 1A is of the type that a waveguide portion 11 is used as a transmission path (a waveguide 10) of length l and along which a signal is transmitted from a wiring layer 14A (a first transmission line) which is disposed on a front surface of a substrate 2 via a dielectric film 16A to a wiring layer 14B (a second transmission line) which is disposed on a back surface of the substrate 2 via a dielectric film 16B as shown in FIG. 1B. The waveguide portion 11 includes: the substrate 2; a pair of conductive films 12A and 12B that are disposed in opposition to each other at least partially on the front surface and the back surface of the substrate 2, respectively; and a plurality of conductive pillars 13 that electrically connect together the conductive film 12A and the conductive film 12B. The waveguide portion 11 according to the first embodiment is the one which is generally called an SIW (Substrate Integrated Waveguide), and the pillars 13 are regularly disposed in the form of a false wall that serves as a reflection surface as illustrated in FIG. 1A, by which the waveguide portion 11 functions as a rectangular waveguide.

Figure 3:
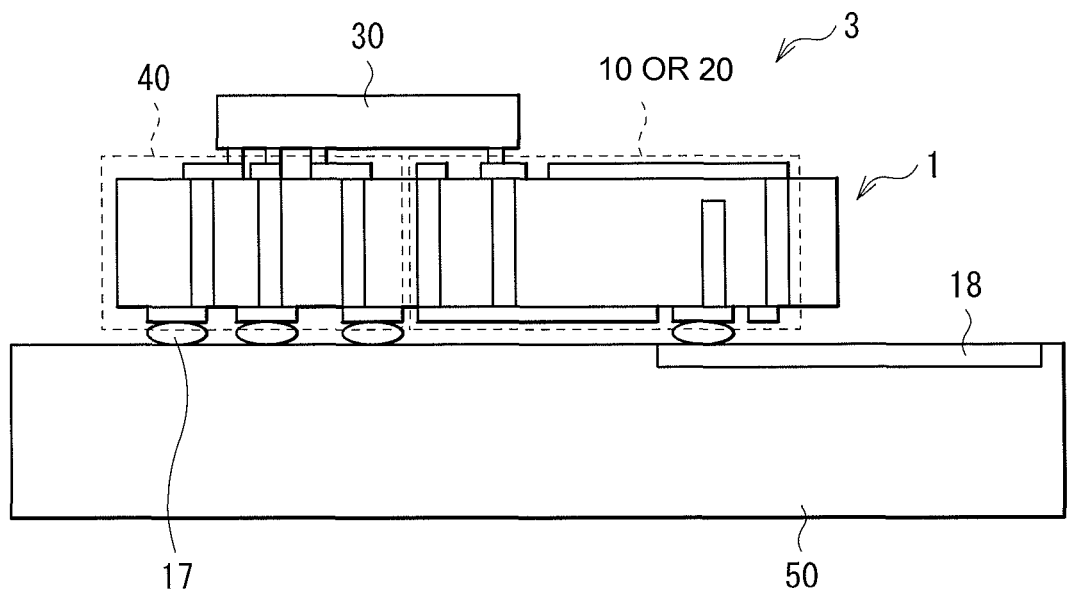
FIG. 3 is a sectional diagram illustrating an example of a configuration of a module that includes an interposer substrate including the waveguide illustrated in FIGS. 1A and 1B or FIG. 2(A)-FIG. 2(C).

It is preferable to use, for example, a high-resistance silicon (Si) substrate about 1000 Ω·cm or higher in resistivity) or a silicon carbide (SiC) substrate from about 50 μm to about 400 μm both inclusive in thickness as the substrate 2, conforming to the material of a later described semiconductor chip 30 (FIG. 3). This is because coefficients of thermal expansion of the substrate 2 and the semiconductor chip 30 become almost equal to each other and hence the reliability in joining the semiconductor chip 30 to the interposer 1A is increased by using the same material as (or similar material to) that of the semiconductor chip 30. It is to be noted that the material of the substrate 2 is not limited to the above. Alternatively, other semiconductor materials and dielectric materials may be used. Examples of other semiconductor materials include SiGe and GaAs without limitation. Examples of dielectric materials include, without limitation: ceramics such as low temperature co-fired ceramics (LTCC); glass (such as Pyrex (registered trademark), SD2, and quartz); resins (such as glass epoxy resins and BT (Bismaleimide Triazine) resins); and organic polymers.

The waveguide 10 includes the substrate 2, the pair of conductive films 12A and 12B formed on the front surface and the back surface of the substrate 2, and the pillars 13 which are regularly arranged into the rectangular form and electrically connect together the conductive films 12A and 12B as described above.

The conductive films 12A and 12B are made of a conductive material, for example, a metal material such as Al (aluminum) and AlCu (aluminum copper) without limitation. Although the thickness of each of the conductive films 12A and 12B may be appropriately adjusted depending on the frequency of a signal used, it is preferable that the thickness be about 3 μm or more for a frequency of about 60 GHz, for example. Openings 12a and 12b are respectively formed in the conductive films 12A and 12B at mutually opposing positions. These openings 12a and 12b are adapted to connect the wiring layers 14A and 14B to later described signal conversion structures (a first conversion structure and a second conversion structure) which are disposed within the waveguide portion 11.

The pillar 13 electrically connects the conductive film 12A with the conductive film 12B, and may be a silicon through electrode (TSV: Through Silicon Via). Although it is preferable to use, for example, copper (Cu) as the material of the pillar 13, a metal material such as aluminum (Al) may be used. That is, there is no particular limitation on the material used. In addition, any electrode diameter (φ) is allowed as long as the conductive films 12A and 12B are electrically connected, which may be about 50 μm, for example. It is to be noted that the length (l) of one side of the waveguide portion 11 which is defined by the false wall, formed by regularly arranging the pillars 13 into the rectangular form, may be appropriately set conforming to the frequency of the signal used, in order to determine the cutoff frequency as in a general waveguide. Concretely speaking, for example, when the relative dielectric constant of Si that makes a substrate concerned is about 11.9, it is preferable that the length (l) be about 1 mm in order to attain the cutoff frequency of about 44 GHz.

In this embodiment, the wiring layers 14A and 14B are microstrip lines, each including, for example, a Cu-plated wiring layer of about 10 μm to about 20 both inclusive in film thickness, a polyimide interlayer film of about 3 μm to about 6 both inclusive in film thickness, and a polyimide insulating film of about 3 μm to about 6 μm both inclusive in film thickness. One (the microstrip line 14A in this embodiment) of these microstrip lines 14A and 14B is connected to the semiconductor chip 30 (FIG. 3) which is loaded on the substrate 2. The other (the microstrip line 14B in this embodiment) is connected to the side of a mounted substrate 50 (FIG. 3) onto which the interposer substrate 1A is to be mounted.

As shown in FIG. 1B, a conversion probe 15A is the signal conversion structure that converts a signal between the waveguide portion 11 and the microstrip line 14A, and a conversion probe 15B is the signal conversion structure that converts a signal between the waveguide portion 11 and the microstrip line 14B. These conversion probes 15A and 15B are formed within the waveguide portion 11 as through electrodes similarly to the above-described pillars 13. In this embodiment, first ends of the conversion probes 15A and 15B are respectively connected to the microstrip lines 14A and 14B and second ends thereof are electrically opened. It is preferable that each of the conversion probes 15A and 15B be arranged at a position that is a central position in a short-side direction of the waveguide portion 11 and that is away by a distance A from the false wall on the short side that serves as the reflection surface in a long-side direction of the waveguide portion 11. The distance A (FIG. 1A) is determined depending on the reflectance properties of the conversion probes 15A and 15B. It is to be noted that the reflectance properties of the conversion probes 15A and 15B change depending on the frequency of the signal used. For example, when the frequency of the signal used is about 60 GHz, it is preferable that the distance A be, for example, about 400 µm.

The dielectric films 16A and 16B are made of a dielectric material that provides a small loss to a high-frequency signal such as, without limitation: an inorganic material including $SiO_2$; and polyimide. The film thickness of each of the dielectric films 16A and 16B is determined depending on factors such as electrical properties, and may range from about 0.5 µm to about 5 µm both inclusive, for example. It is to be noted that materials such as, without limitation, benzocyclobutene (BCB) and Diamond-Like Carbon (DLC) may be also used for the dielectric films 16A and 16B, in addition to the above-described materials.

[Operation and Effects]

The high-frequency signal such as a millimeter-wave signal is transmitted in the following manner in the interposer substrate 1A in the first embodiment. First, a quasi-TEM (Transverse Electromagnetic) mode signal that propagates through the microstrip line 14A is input into the waveguide portion 11 by the conversion probe 15A and is converted into, for example, a TE10 (Transverse Electric 10) mode (a waveguide mode) signal by emitting electric fields. Then, the signal that has propagated within the waveguide portion 11 is converted again into the quasi-TEM mode signal by the conversion probe 15B and is output to the microstrip line 14B. As a whole, the signal that propagates through the microstrip line 14A disposed on the front surface of the interposer substrate 1A is transmitted from the microstrip line 14A to the microstrip line 14B disposed on the back surface of the substrate 1A by being once converted to the waveguide mode signal.

As described in the foregoing, a method is reported in which, upon connecting a semiconductor chip and a mounted substrate that are different from each other in pitch with use of an interposer, a coaxial TSV is formed in place of an existing TSV to improve impedance mismatching in millimeter-wave bands and high-frequency regions exceeding the millimeter-wave bands. However, this method has a disadvantage in that, since the dedicated specific process is used to form the coaxial TSV within the substrate, the manufacturing step is complicated, development of the novel material is unavoidable and hence the manufacturing cost is increased.

As a method of eliminating this disadvantage, a method may be contemplated, in which a transmission line, which may be implemented by a wiring layer that includes two layers or less as in a microstrip line and a coplanar line that are generally used in an interposer, is used for the transmission line. However, this method is disadvantageous in that, since an electric field spreads out to the outside of the line, a crosstalk with lines such as another signal line and a power line may occur. This is prominent at high frequencies exceeding millimeter-wave frequencies. Although the crosstalk may be suppressed by keeping a predetermined distance between the lines, such a disadvantage associates that the area for wiring is increased in the above-mentioned case.

In contrast, in the interposer substrate 1A that includes the waveguide 10 according to the first embodiment, the waveguide 10 that is structured by: the waveguide portion 11 including the pair of opposing surfaces; and the microstrip lines 14A and 14B which are disposed respectively on the front surface and back surface of the waveguide portion 11, is formed within the substrate 2. Thus, the waveguide can suppress impedance mismatching of the electric signal transmitted between the front and the back surfaces of the waveguide portion 11.

As described in the foregoing, in the first embodiment, the waveguide portion 11, provided with the microstrip lines 14A and 14B that are formed respectively on the front surface and the back surface of the pair of opposing surfaces of the waveguide portion 11, is formed within the substrate 2, and is used as the waveguide 10 of the signal that propagates from the front surface to the back surface (or vice versa) of the interposer substrate 1A. Thus, the structure can suppress impedance mismatching of the electric signal transmitted between the front and back surfaces to reduce the reflection loss of the electric signal.

In addition, since the interposer substrate 1A which is reduced in reflection loss is formed to have such a simple structure as mentioned above, it is allowed to form the substrate 1A by using existing manufacturing step and material, by which it is allowed to suppress an increase in manufacturing cost.

Further, since the waveguide 10 is surrounded by the plurality of pillars 13 which serve as the TSVs that form the false wall and by the pair of the opposing conductive films 12A and 12B, it can exhibit excellent EMC (electromagnetic compatibility) properties. Thus, provision of a buffering region for noise prevention is eliminated and hence higher-density integration with other wirings is allowed. In addition, wiring for higher frequencies, particularly but not limitedly, ranging from millimeter-wave frequencies to terahertz-wave frequencies is allowed within the interposer substrate 1A.

Still further, the interposer substrate 1A according to the first embodiment is superior to the existing interposer substrate structured as mentioned above in tolerance due to manufacturing accuracy for impedance matching and hence exhibits excellent manufacturing robustness.

2. Second Embodiment

FIGS. 2(A) and 2(B) illustrate examples of planar configurations of a front surface (FIG. 2(A)) and a back surface (FIG. 2(B)) of an interposer substrate 1B that includes a waveguide 20 (FIG. 2(A)) according to the second embodiment of the present technology. FIG. 2(C) illustrates an example of a sectional configuration taken along the one dot chain line II-II in FIGS. 2(A) and 2(B). A waveguide portion 21 (FIG. 2(A)) which is disposed within the interposer substrate 1B (FIG. 2(A)) in the second embodiment includes: a pair of conductive films (a first layer 22A (FIGS. 2(A) and 2(C)) and a sixth layer 22F (FIGS. 2(B) and 2(C))) which are respectively arranged on a font surface and a back surface of a substrate 2 in opposition to each other; and rectangular conductor walls 23A and 23B (FIGS. 2(A) and 2(B)) which are arranged in opposition to each other so as to electrically connect together the first layer 22A and the sixth layer 22F. The first layer 22A is connected with a microstrip line 24A (FIG. 2(A)) which is a first transmission line disposed on the front surface of the substrate 2, via a tapered microstrip 25A (FIG. 2(A)). The sixth layer 22F is connected with a microstrip line 24B (FIG. 2(B)) which is a second transmission line disposed on the back surface of the substrate 2, via a tapered microstrip 25B (FIG. 2(B)). It is to be noted that the same numerals are assigned to the same constitutional elements as those in the first embodiment and description thereof will be omitted.

In this embodiment as shown in FIG. 2(C), the substrate 2 has a layer structure (for example, six-layer structure) and conductive films 22 (a second layer $22B_2$ to a fifth layer $22E_2$) are disposed between the respective layers as described in detail later. Although there is no particular limitation on the film thickness of each layer and the film thickness may be appropriately adjusted depending on the frequency of the signal used, it is preferable that the film thickness be at least about 3 μm for a frequency of about 60 GHz, for example. Although the same materials as those of the substrate 1 in the first embodiment may be used as the materials of the substrate 2, it is preferable that an LTCC substrate be used in the second embodiment.

The waveguide portion 21 includes: the first layer 22A and the sixth layer 22F which are arranged respectively on the front surface and the back surface of the substrate 2 in opposition to each other; and the conductor walls 23A and 23B which are arranged in opposition to each other so as to electrically connect together the first layer 22A and the sixth layer 22F in the long-side direction as described above. Since the conductor walls 23A and 23B serve as conductor walls structuring the waveguide portion, a distance B (FIG. 2(A)) between the conductor wall 23A and the conductor wall 23B may be appropriately set depending on the frequency of the signal used as in the first embodiment. Concretely speaking, for example, when the relative dielectric constant of the LTCC that serves as the substrate is about 7, it is preferable that the distance B be about 1.3 mm in order to obtain the cutoff frequency of about 44 GHz. It is to be noted that in forming of the conductor walls 23A and 23B, after the substrate 2 that includes six layers and the conductive films on planes 22B to 22E disposed between the respective layers of the substrate 2 are formed, a predetermined region that extends from the front surface to the back surface of the substrate 2 is removed by etching or the like. Then, the conductor walls 23A and 23B may be formed, for example, by the same method as that used in formation of the through electrode. After the conductor walls 23A and 23B are formed, metal films which eventually serve as the conductive films 22 (the first layer 22A and the sixth layer 22F) and the tapered microstrips 25A and 25B are formed respectively on the front surface and the back surface of the substrate 2 by plating or the like.

The conductive film 22 has the six-layer structure that includes the first layer 22A and the sixth layer 22F which are disposed respectively on the front surface and the back surface of the substrate 2, and the second layer $22B_2$ to the fifth layer $22E_2$ which are disposed between the respective layers of the six-layer substrate 2 as described above. The second layer $22B_2$ to the fifth layer $22E_2$ are disposed independently of one another on planes 22B to 22E of the respective layers structuring the substrate 2 at respective positions corresponding to the tapered microstrips 25A and 25B. Concretely speaking, a second layer $22B_1$ to a fifth layer $22E_1$ are formed stepwise in this order under the tapered microstrip 25A that is formed on the front surface of the substrate 2 as illustrated in FIG. 2(C). A fifth layer $22E_2$ to a second layer $22B_2$ are formed stepwise in this order above the tapered microstrip 25B that is formed on the back surface of the substrate 2 as illustrated in FIG. 2(C).

In the second embodiment, the tapered microstrip 25A and the second layer $22B_1$ to the fifth layer $22E_1$, the second layer $22B_1$ to the fifth layer $22E_1$ being formed stepwise under the microstrip 25A, structure a first conversion structure 25a (FIG. 2(C)). The tapered microstrip 25B and the second layer $22B_2$ to the fifth layer $22E_2$, the second layer $22B_2$ to the fifth layer $22E_2$ being formed stepwise above the microstrip 25B, structure a second conversion structure 25b (FIG. 2(C)). It is to be noted that the second layer $22B_1$ to the fifth layer $22E_1$ are electrically connected together respectively by through electrodes, $26a(26a_1$ to $26a_3)$ and the fifth layer $22E_2$ is connected to the sixth layer 22F via a through electrode $26a_4$. In addition, the fifth layer $22E_2$ to the second layer $22B_2$ that structure the second conversion structure 25b are also electrically connected together respectively by through electrodes $26b_1$ to $26b_3$, and the second layer $22B_2$ is connected to the first layer 22A via a through electrode $26b_4$.

It is to be noted that the reflectance properties of the first conversion structure 25a and the second conversion structure 25b change depending on the lengths (l) and widths (w) of the tapered microstrips 25A and 25B. Concretely speaking, the larger a value l/w is, the more the reflectance properties are suppressed and it is preferable that the value l/w be almost 1/w>1. The same materials as those of the conductive films 12A and 12B in the first embodiment may be used as the materials of the first layer 22A to the sixth layer 22F and the tapered microstrips 25A and 25B.

Each of the microstrip lines 24A and 24B includes, for example: a Cu-plated wiring layer of about 1 μm to about 2 μm both inclusive in film thickness; a polyimide interlayer film of about 6 μm to about 10 μm both inclusive in film thickness; and a polyimide insulating film of about 6 μm to about 10 μm both inclusive in film thickness, similarly to the microstrip lines 14A and 14B in the above-described first embodiment. The microstrip lines 24A and 24B are respectively connected to the first layer 22A and the sixth layer 22F via the tapered microstrips 25A and 25B.

In the interposer substrate 1B in the second embodiment which is configured as mentioned above, a high-frequency signal such as a millimeter-wave signal is transmitted in the following manner. First, a signal which is in the TEM mode that propagates through the microstrip line 24A is input into the waveguide portion 21 while maintaining a vertical electric-field distribution by the tapered structure of the first conversion structure 25a, and is converted into a signal which is in the TE10 mode. Next, the signal that has propagated within the waveguide portion 21 is converted again into the quasi-TEM mode signal while maintaining the vertical electric-field distribution by the tapered structure of the second conversion structure 25b as with the first conversion structure, and is output to the microstrip line 24B. As a whole, the signal that propagates through the microstrip line 24A, which is disposed on the front surface of the interposer substrate 1B, is transmitted from the microstrip line 24A to the microstrip line 24B, which is disposed on the back surface of the substrate 1B, by being once converted into the waveguide mode signal.

The interposer substrate 1B that includes the waveguide 20 according to the second embodiment achieves effects similar to those of the interposer substrate 1A according to the above-described first embodiment, and in addition thereto, reduces the reflection loss over a wide band.

3. Application Examples

Next, examples that the interposer substrates 1A and 1B according to the first embodiment and the second embodiment described above are applied to an electronic apparatus will be described.

(Module)

FIG. 3 illustrates an example of a sectional configuration of a radio communication module 3 in a millimeter-wave band that uses the above-described waveguide 10 or 20. The module 3 has a structure that includes: the semiconductor chip 30 that generates, for example, a millimeter-wave signal; a power line 40 for power supply to the semiconductor chip 30; the mounted substrate 50 that supplies a baseband signal, and sends and receives the millimeter-wave signal supplied from the semiconductor chip 30 via an antenna 18; and the interposer substrate 1, which are connected together via bumps 17. This module 3 connects together the semiconductor chip 30 and the mounted substrate 50 which are different from each other in pitch via the interposer substrate 1 in which, for example, the waveguide 10 of the above-described waveguides 10 and 20 is built in, to receive the millimeter-wave signal supplied from the semiconductor chip 30 and send the signal to the mounted substrate 50 side.

The module 3 in this application example is allowed to transmit the high-frequency signal such as the millimeter-wave signal generated by the semiconductor chip 30 to the mounted substrate 50 with low loss and low reflection by using the interposer substrate 1A (1B) that includes the waveguide 10 (20) so described in the above-described first (second) embodiment.

(Electronic Apparatus)

Figure 4:
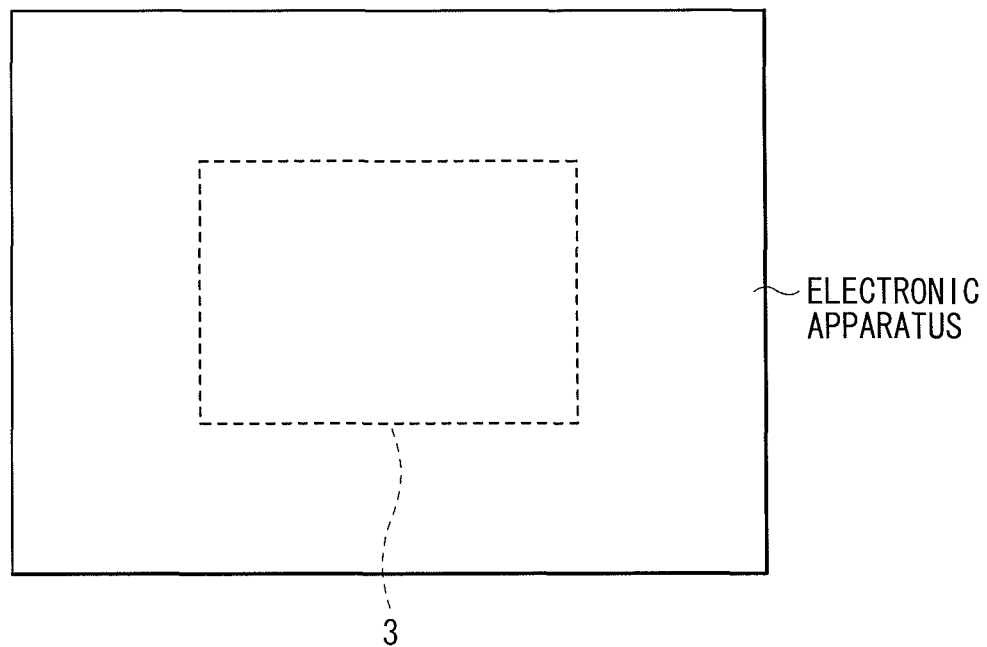
FIG. 4 is a block diagram illustrating an example of a function of an electronic apparatus according to an application example of the module.

The above-described module 3 is incorporated into an electronic apparatus, for example, as illustrated in FIG. 4. Concretely speaking, the module 3 is applicable to an electronic apparatus in any field such as, but not limited to, a personal digital assistant (PDA), wireless LAN equipment, a TV set, a digital camera, a notebook personal computer, a portable terminal including a cell phone, and a video camera. In other words, the above-described module 3 is applicable to an electronic apparatus in any field that sends and receives a signal input from the outside, or a signal generated in the apparatus.

Although the present technology has been described by giving the first and second embodiments and the application examples thereof as mentioned above, the present technology is not limited to the above-described embodiments and application examples and may be modified in a variety of ways. For example, a CPW (Coplanar Waveguide) may be used as the transmission line in place of the microstrip line.

In addition, although the silicon substrate is used as the waveguide portion in the above mentioned first embodiment, the inside of this silicon substrate may be made hollow. However, in this case, since the dielectric constant within the waveguide portion is reduced to about 1, the waveguide portion may be designed to have a wider width. Further, although the first transmission line has the same structure as the second transmission line in the above-described example embodiments, transmission lines of different structures may be used.

Accordingly, it is possible to achieve at least the following configurations from the above-described example embodiments, the modifications, and the application examples of the disclosure.

(1) A waveguide, including:
a waveguide portion including a first surface and a second surface that are opposed to each other;
a first transmission line provided on the first surface of the waveguide portion;
a second transmission line provided on the second surface of the waveguide portion; and
a first conversion structure inputting a signal from the first transmission line to the waveguide portion and converting the signal.

(2) The waveguide according to (1), further including a second conversion structure that outputs the signal from the waveguide portion to the second transmission line and converts the signal.

(3) The waveguide according to (1) or (2), wherein the waveguide portion includes a pair of conductive films that are opposed to each other, and a plurality of conductive pillars that connect the pair of conductive films together.

(4) The waveguide according to any one of (1) to (3), wherein the waveguide portion includes a pair of conductive films that are opposed to each other, and a pair of conductor walls that are disposed to oppose each other between the pair of conductive films.

(5) The waveguide according to any one of (1) to (4), wherein the first transmission line, the second transmission line, or both of the first transmission line and the second transmission line includes a microstrip line.

(6) The waveguide according to any one of (1) to (5), wherein the first conversion structure and the second conversion structure each include a through electrode.

(7) The waveguide according to any one of (1) to (6), wherein the first conversion structure and the second conversion structure each include a tapered microstrip.

(8) An interposer substrate with an insulating substrate and a waveguide provided in the substrate, the waveguide including:
a waveguide portion including a first surface and a second surface that are opposed to each other;
a first transmission line provided on the first surface of the waveguide portion;
a second transmission line provided on the second surface of the waveguide portion; and
a first conversion structure inputting a signal from the first transmission line to the waveguide portion and converting the signal.

(9) The interposer substrate according to (8), wherein the substrate includes any one of: a high-resistance silicon substrate having a resistivity of about 1000 $\Omega$·cm or higher; a low-temperature co-fired ceramic; a glass; quartz; and a ceramic.

(10) A module with an interposer substrate and a semiconductor chip, the interposer substrate being provided with a waveguide in an insulating substrate, and the semiconductor chip being mounted on the interposer substrate, the waveguide including:
a waveguide portion including a first surface and a second surface that are opposed to each other;
a first transmission line provided on the first surface of the waveguide portion;
a second transmission line provided on the second surface of the waveguide portion; and
a first conversion structure inputting a signal from the first transmission line to the waveguide portion and converting the signal.

(11) An electronic apparatus with an interposer substrate, a semiconductor chip, and a mounted substrate, the interposer substrate being provided with a waveguide in an insulating substrate, the semiconductor chip being mounted on the interposer substrate, and the mounted substrate being electrically connected with the interposer substrate, the waveguide including:
a waveguide portion including a first surface and a second surface that are opposed to each other;
a first transmission line provided on the first surface of the waveguide portion;
a second transmission line provided on the second surface of the waveguide portion; and
a first conversion structure inputting a signal from the first transmission line to the waveguide portion and converting the signal.

The disclosure contains subject matter related to that disclosed in Japanese Priority Patent Application JP 2011-

273547 filed in the Japan Patent Office on Dec. 14, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A waveguide, comprising:
    a waveguide portion including a first surface and a second surface that are opposed to each other;
    a first transmission line on the first surface of the waveguide portion;
    a second transmission line on the second surface of the waveguide portion;
    a first conversion structure through which a signal from the first transmission line to the waveguide portion can be input and converted; and
    a second conversion structure that outputs the signal from the waveguide portion to the second transmission line and converts the signal,
    wherein,
        the waveguide portion includes a pair of conductive films that are opposed to each other, a plurality of conductive pillars that connect the pair of conductive films together, and a pair of conductor walls that are disposed to opposed to each other between the pair of conductive films, and
        the first conversion structure and the second conversion structure each comprise a through electrode.

2. The waveguide according to claim 1, wherein the first transmission line, the second transmission line, or both of the first transmission line and the second transmission line comprises a microstrip line.

3. The waveguide according to claim 1, wherein the first conversion structure and the second conversion structure each comprise a tapered microstrip.

4. A waveguide, comprising:
    a waveguide portion including a first surface and a second surface that are opposed to each other;
    a first transmission line on the first surface of the waveguide portion;
    a second transmission line on the second surface of the waveguide portion;
    a first conversion structure through which a signal from the first transmission line to the waveguide portion can be input and converted; and
    a second conversion structure that outputs the signal from the waveguide portion to the second transmission line and converts the signal,
    wherein,
        the waveguide portion includes a pair of conductive films that are opposed to each other, and a pair of conductor walls that are opposed to each other between the pair of conductive films.

5. A waveguide, comprising:
    a waveguide portion including a first surface and a second surface that are opposed to each other;
    a first transmission line on the first surface of the waveguide portion;
    a second transmission line on the second surface of the waveguide portion;
    a first conversion structure through which a signal from the first transmission line to the waveguide portion can be input and converted; and
    a second conversion structure that outputs the signal from the waveguide portion to the second transmission line and converts the signal,
    wherein,
        the waveguide portion includes a pair of conductive films that are opposed to each other, and a plurality of conductive pillars that connect the pair of conductive films together.

6. A waveguide, comprising:
    a waveguide portion including a first surface and a second surface that are opposed to each other;
    a first transmission line on the first surface of the waveguide portion;
    a second transmission line on the second surface of the waveguide portion;
    a first conversion structure through which a signal from the first transmission line to the waveguide portion can be input and converted; and
    a second conversion structure that outputs the signal from the waveguide portion to the second transmission line and converts the signal,
    wherein,
        the first conversion structure and the second conversion structure each comprise a through electrode.

7. An electronic apparatus with an interposer substrate, a semiconductor chip, and a mounted substrate, the interposer substrate being provided with a waveguide in an insulating substrate, the semiconductor chip being mounted on the interposer substrate, and the mounted substrate being electrically connected with the interposer substrate, the waveguide comprising:
    a waveguide portion including a first surface and a second surface that are opposed to each other;
    a first transmission line on the first surface of the waveguide portion;
    a second transmission line on the second surface of the waveguide portion;
    a first conversion structure through which a signal from the first transmission line to the waveguide portion can be input and converted; and
    a second conversion structure that outputs the signal from the waveguide portion to the second transmission line and converts the signal,
    wherein,
        the waveguide portion includes a pair of conductive films that are opposed to each other, a plurality of conductive pillars that connect the pair of conductive films together, and a pair of conductor walls that are disposed to opposed to each other between the pair of conductive films, and
        the first conversion structure and the second conversion structure each comprise a through electrode.

8. An interposer substrate with an insulating substrate and a waveguide provided in the substrate, the waveguide comprising:
    a waveguide portion including a first surface and a second surface that are opposed to each other;
    a first transmission line on the first surface of the waveguide portion;
    a second transmission line on the second surface of the waveguide portion;
    a first conversion structure through which a signal from the first transmission line to the waveguide portion can be input and converted; and
    a second conversion structure that outputs the signal from the waveguide portion to the second transmission line and converts the signal, wherein,
the waveguide portion includes a pair of conductive films that are opposed to each other, a plurality of conductive pillars that connect the pair of conductive films together, and a pair of conductor walls that are disposed to opposed to each other between the pair of conductive films, and
the first conversion structure and the second conversion structure each comprise a through electrode.

9. The interposer substrate according to claim 8, wherein the substrate comprises any one of: a high-resistance silicon substrate having a resistivity of about 1000 Ω·cm or higher; a low-temperature co-fired ceramic; a glass; quartz; and a ceramic.

10. A module with an interposer substrate and a semiconductor chip, the interposer substrate being provided with a waveguide in an insulating substrate, and the semiconductor chip being mounted on the interposer substrate, the waveguide comprising:
a waveguide portion including a first surface and a second surface that are opposed to each other;
a first transmission line on the first surface of the waveguide portion;
a second transmission line on the second surface of the waveguide portion;
a first conversion structure through which a signal from the first transmission line to the waveguide portion can be input and converted; and
a second conversion structure that outputs the signal from the waveguide portion to the second transmission line and converts the signal,
wherein,
the waveguide portion includes a pair of conductive films that are opposed to each other, a plurality of conductive pillars that connect the pair of conductive films together, and a pair of conductor walls that are disposed to opposed to each other between the pair of conductive films, and
the first conversion structure and the second conversion structure each comprise a through electrode.

* * * * *